United States Patent
Lamorey et al.

(10) Patent No.: US 9,245,083 B2
(45) Date of Patent: Jan. 26, 2016

(54) METHOD, STRUCTURES AND METHOD OF DESIGNING REDUCED DELAMINATION INTEGRATED CIRCUITS

(75) Inventors: Mark C. H. Lamorey, South Burlington, VT (US); David B. Stone, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1063 days.

(21) Appl. No.: 13/272,395

(22) Filed: Oct. 13, 2011

(65) Prior Publication Data

US 2015/0206835 A1    Jul. 23, 2015

(51) Int. Cl.
*H01L 23/48* (2006.01)
*G06F 17/50* (2006.01)
*H01L 21/768* (2006.01)
*H01L 23/522* (2006.01)

(52) U.S. Cl.
CPC ...... *G06F 17/5077* (2013.01); *H01L 21/76883* (2013.01); *H01L 23/522* (2013.01); *H01L 2224/11* (2013.01); *H01L 2924/0002* (2013.01)

(58) Field of Classification Search
CPC ............ H01L 21/76883; H01L 23/528; H01L 2224/3225; H01L 2224/73267; H01L 2224/8203; H01L 2224/04105; H01L 2224/24226; H01L 2224/92244; G06F 17/5077
USPC ......... 438/612, 614, 617, 106–109, 112, 113, 438/127, 613; 257/737–738
See application file for complete search history.

(56) References Cited

U.S. PATENT DOCUMENTS

| | | |
|---|---|---|
| 5,446,243 A | 8/1995 | Crowder et al. |
| 6,057,231 A | 5/2000 | Givens et al. |
| 6,232,668 B1 | 5/2001 | Hikita et al. |
| 6,313,024 B1 | 11/2001 | Cave et al. |
| 7,449,371 B2 | 11/2008 | Kemerling et al. |
| 7,741,696 B2 | 6/2010 | Marques |
| 7,858,448 B2 | 12/2010 | Goebel et al. |
| 2005/0101116 A1 | 5/2005 | Tseng |
| 2005/0114819 A1* | 5/2005 | Goren et al. ............ 716/11 |
| 2008/0082300 A1 | 4/2008 | Baumgartner et al. |
| 2011/0024900 A1 | 2/2011 | Walter et al. |
| 2011/0254156 A1* | 10/2011 | Lin ..................... 257/737 |

OTHER PUBLICATIONS

Liu et al., Chip-Package-Interaction Modeling of Ultra Low-K/Copper Back End of Line. International Interconnect Technology Conference, 2007. 3 pages.

Subramanian et al.; Performance Impact from Metal Fill Insertion. Freescale Semiconductor Session #4.2 (Physical Design) CDNLive! 2007. 12 pages.

* cited by examiner

*Primary Examiner* — Hoa B Trinh
(74) *Attorney, Agent, or Firm* — Thompson Hine LLP

(57) ABSTRACT

An integrated circuit wire structure. The structure includes a set of interconnect levels over a semiconductor substrate, each interconnect level of the set of interconnect levels comprising operational wires embedded in an interlevel dielectric layer; a dielectric barrier layer on an uppermost interconnect level of the set of interconnect levels and a bonding pad on the passivation layer; a stress reduction zone surrounding a perimeter of the bonding pad and extending into the set of interconnect levels; elongated fill wires in each of the interconnect levels in the stress reduction zone, the elongated fill wires not connected to any of the non-ground operational wires; and the elongated fill wires of each interconnect level of each set of interconnect levels physically connected to elongated fill wires of immediately upper and lower interconnect levels of the set of fill levels.

22 Claims, 8 Drawing Sheets

METHOD, STRUCTURES AND METHOD OF DESIGNING REDUCED DELAMINATION INTEGRATED CIRCUITS

FIELD OF THE INVENTION

The present invention relates to the field of integrated circuits; more specifically, it relates to structures for, methods of fabricating, and method of designing reduced delamination integrated circuits.

BACKGROUND

Integrated circuits include devices formed in a semiconductor substrate and wires formed in multiple interconnection levels that connect the devices into circuits. The interconnect levels include wires embedded in a dielectric layer. The last wiring level is a C4 bond pad. When the dielectric layers of the some interconnect levels are formed from certain dielectric materials, structural failure of those interconnect levels under the C4 bond pad can occur. Accordingly, there exists a need in the art to mitigate or eliminate the deficiencies and limitations described hereinabove.

SUMMARY

A first aspect of the present invention is a structure, comprising: a set of interconnect levels over a semiconductor substrate, each interconnect level of the set of interconnect levels comprising operational wires embedded in an inter-level dielectric layer; a dielectric barrier layer on an uppermost interconnect level of the set of interconnect levels and a bonding pad on the passivation layer; a stress reduction zone surrounding a perimeter of the bonding pad and extending into the set of interconnect levels; elongated fill wires in each of the interconnect levels in the stress reduction zone, the elongated fill wires (i) not connected to any of the operational wires or (ii) connected only to a ground network; and the elongated fill wires of each interconnect level of each set of interconnect levels physically connected to elongated fill wires of immediately upper and lower interconnect levels of the set of fill levels.

A second aspect of the present invention is a method, comprising: forming a set of interconnect levels over a semiconductor substrate, each interconnect level of the set of interconnect levels comprising operational wires embedded in an interlevel dielectric layer; forming a dielectric barrier layer on an uppermost interconnect level of the set of interconnect levels and a bonding pad on the passivation layer; designating a stress reduction zone surrounding a perimeter of the bonding pad and extending into the set of interconnect levels; forming elongated fill wires in each of the interconnect levels in the stress reduction zone, the elongated fill wires (i) not connected to any of the operational wires or (ii) connected only to a ground network; and wherein the elongated fill wires of each interconnect level of each set of interconnect levels are physically connected to elongated fill wires of immediately upper and lower interconnect levels of the set of fill levels.

A third aspect of the present invention is a method of designing an interconnect level of an integrated circuit design, comprising: (a) selecting an interconnect level design from a set of interconnect level designs; (b) using a computer, placing stress reduction shapes representing fill wire portions or via portions of elongated fill wires into the selected interconnect level design, the selected interconnect level design including shapes representing operational wires to generate a first modified interconnect level design; (c) using a computer, placing chemical-mechanical-polish (CMP) dummy shapes into the first modified interconnect level design to generate a second modified interconnect level design; (d) storing the second modified design on a computer readable medium; and (e) repeating steps (a) through (d) for each interconnect level design of the set of interconnect designs.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1:
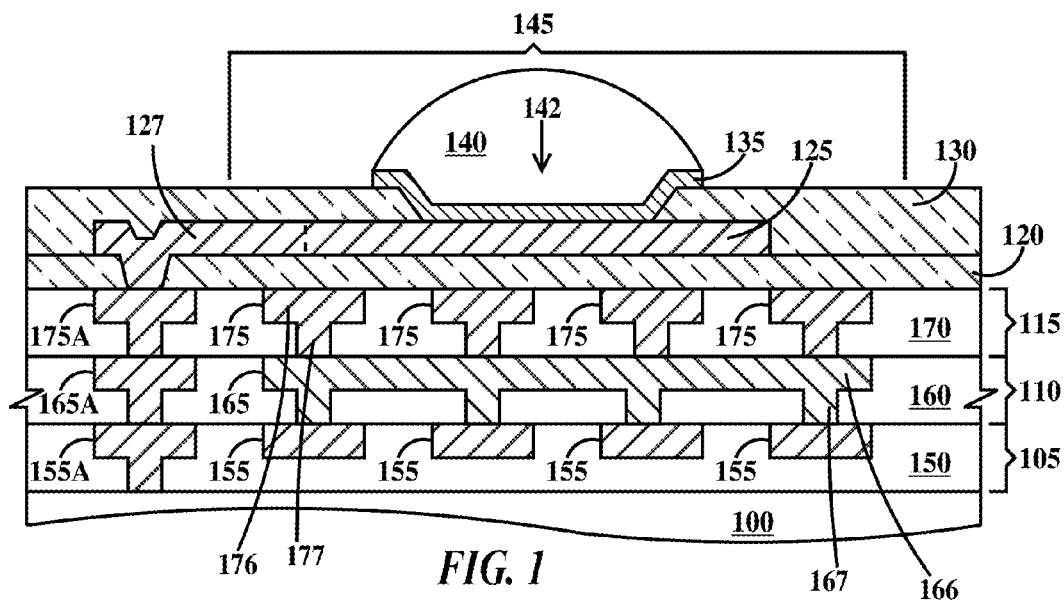
FIG. 1 is a cross-section view through an integrated circuit according to an embodiment of the present invention.

When certain ultra-low K dielectric materials are used as the dielectric portion of interconnect levels of solder bumped integrated circuit chips, because of their low Young's modulus, structural failure (including delamination or actual breaking away of sections of the interconnect levels) can occur because of mismatch between the coefficients of expansion between the integrated circuit chip and the module or package to which the chip is solder bonded. The embodiments of the present invention provide elongated reinforcing metal structures (i.e., fill wires) embedded in the dielectric layers under the controlled-chip-collapse-connection (C4) bond pads to interconnect those layers physically.

A damascene process is one in which wire trenches or via openings are formed in a dielectric layer, an electrical conductor of sufficient thickness to fill the trenches is deposited in the trenches and on a top surface of the dielectric. A chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed, the process is called single-damascene.

A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. An electrical conductor of sufficient thickness to fill the trenches and via openings is deposited and a CMP process is performed to make the surface of the conductor in the trench co-planar with the surface of the dielectric layer to form dual-damascene wires and dual-damascene wires having integral dual-damascene vias.

Wires that form part of the operational wiring of the integrated circuit (e.g., carry power and signals) and connect devices such as transistors into circuits are defined as operational wires.

CMP dummy shapes are often placed in the wiring design levels of damascene and dual damascene in order to provide a uniform metal area to dielectric area ratio to avoid uneven polishing in CMP processes. CMP dummy shapes are defined as square shapes in design shapes files and become square clear or square opaque regions on photomasks generated from the circuit design, which in turn result in square (allowing for rounding of corners) CMP fill shapes on actual integrated circuits. CMP fill shapes exist as square metal islands embedded between wires or square openings in wide wires. By contrast, the fill wires of the present invention are not square, but elongated rectangles. In the embodiments of the present invention, CMP fill shapes are formed simultaneously with and of the same materials as the wires of the interconnect level in which they are placed. CMP fill shapes are not required for operation of the integrated circuit. In one example, each CMP fill shape is not physically or electrically connected to any wire or via or other CMP fill shape contained in the same wiring level as the CMP fill shape or to any other wire or via or other CMP fill shape in other wiring levels. In one example, each CMP fill shape is not physically or electrically connected to any wire or via or other CMP fill shape contained in the same wiring level as the CMP fill shape or to any other wire or via in other wiring levels, but CMP fill shapes in adjacent interconnect levels may be connected.

A low-K dielectric material is defined as dielectric material having a relative permittivity of between about 2.4 and about 3. An ultra-low-K (ULK) dielectric material is defined as a dielectric material having a relative permittivity of about 2.4 or less. In one example, the ULK dielectric materials of the embodiments of the present invention have a modulus of elasticity of about of about 5 GPa or less compared to FTEOS (fluorinated tetraethoxysilane) 70 GPa and copper 150 GPa.

According to embodiments of the present invention, stress reduction shapes are placed in the design levels of damascene and dual damascene wiring layers in order to reinforce the chip under bonding pads. Stress reduction shapes exist in shapes files of wiring levels of a circuit design and become opaque or clear regions shapes on photomasks generated from the circuit design, which in turn result in fill wires on actual integrated circuits. In one example, the fill wires of the present invention are placed in the ULK dielectric ILD layers. In one example, the fill wires of the present invention are placed in ILD above the ULK dielectric ILD layers. Such placements reduce or prevent delamination of the ULK ILD layers. They are also placed in a manner to provide a uniform metal area to dielectric area ratio to avoid uneven polishing in CMP processes. Fill wires exist as elongated metal islands (when viewed from above) embedded in single-damascene or dual-damascene interconnect levels. In the embodiments of the present invention, fill wires are formed simultaneously with and of the same materials as the operational wires of the interconnect level in which they are placed. In one example, each fill wire is not physically or electrically connected to any operational wire or via contained in the same wiring level as the fill wire or to any other operational wire or via in other interconnect levels. However, fill wires are physically connected to fill wires contained in adjacent interconnect levels. Fill wires do not form part of operational wiring of the integrated circuit wiring. In one example, while not forming part of the operational circuitry of the integrated circuit, the fill wires are electrically connected to the ground network of the integrated circuit.

FIG. 1 is a cross-section view through an integrated circuit according to an embodiment of the present invention. In FIG. 1, formed over a semiconductor substrate 100 are a first interconnect level 105, a second interconnect level 110 and an third interconnect level 115. Interconnect level 110 is formed on interconnect level 105 and interconnect level 115 is formed on interconnect level 110. Formed on interconnect level 115 is dielectric barrier layer 120. In one example, dielectric barrier layer 120 is a barrier to ionic diffusion. In one example, dielectric barrier layer 120 comprises silicon nitride. Formed on dielectric barrier layer 120 is a metal bond pad 125 integrally formed with an operational wire 127. Formed on dielectric barrier layer 120 and perimeter regions of bond pad 125 is a dielectric passivation layer 130. In one example, dielectric barrier layer 130 is a moisture barrier. In one example, dielectric passivation layer 130 comprises polyimide. A layer of ball limiting metallurgy (BLM) 135 is formed on dielectric passivation layer 130 and on C4 bond pad 125 (hereafter bond pad 125) through an opening 142 in dielectric passivation layer 130. BLM is also known as under bump metallurgy (UBM) or pad limiting metallurgy (PLM). In one example, PLM comprises one or more layers of material selected from the group of materials consisting of chrome, copper, gold and nickel. Formed on PLM 135 is a solder bump 140. In one example, solder-bump 140 comprises tin, silver, or combinations thereof. A stress reduction zone (SRZ) 145 is defined as enclosing the perimeter of bond pad 125.

Interconnect level 105 includes an interlevel dielectric (ILD) dielectric layer 150 with damascene fill wires 155 and an operational wire 155A embedded in dielectric layer 150. Interconnect level 110 includes an ILD layer 160 with dual-damascene fill wires 165 and an operational wire 165A embedded in ILD layer 160. Dual-damascene fill wires 165 have wire portions 166 and an integral via portions 167. Via portion 167 physically connects dual-damascene fill wires 165 to damascene fill wires 155. ILD Interconnect level 115 includes an ILD layer 170 with dual-damascene fill wires 175 and an operational wire 175A embedded in ILD layer 170. Operational wire 175A is physically and electrically connected to operational wire 165A. Dielectric barrier layer 120 prevents dual-damascene fill wires 175 from contacting bond pad 125. In one example, ILD layers 150, 160 and 170 comprise ULK dielectric materials, an example of which is octametylcyclotetrailoxane. In one example, operational wires and fill wires comprise copper. In one example, operational wires and fill wires comprise an electrically conductive liner on sidewalls and a bottom surface of an electrical core conductor. In one example, the core conductor is copper and the liner comprises one or more layers of titanium, titanium nitride, tantalum and tantalum nitride.

There are additional interconnect levels (not shown in FIG. 1) below interconnect level 105 that do not use an ULK dielectric and contain operational wires and may contain CMP fill shapes and fill wires as well. The ILD layer of these additional interconnect levels may comprise silicon nitride, silicon oxide, or combinations thereof. While three interconnect levels are illustrated in FIG. 1, there may be as a few as one or there may be more than three. In one example, fill wires are formed in all layers using ULK dielectrics. Optionally, fill wires may be formed in one or more of the additional interconnect levels using conventional dielectric materials (e.g., silicon nitride and silicon dioxide). Fill wires in the additional interconnect levels are physically connected to the fill wires in the ULK interconnect levels to further anchor and strengthen the ULK interconnect levels under the bond pads. (Fill wires 155 would then be dual-damascene wires so the via portions could connect to the fill wires below.)

Figure 2:
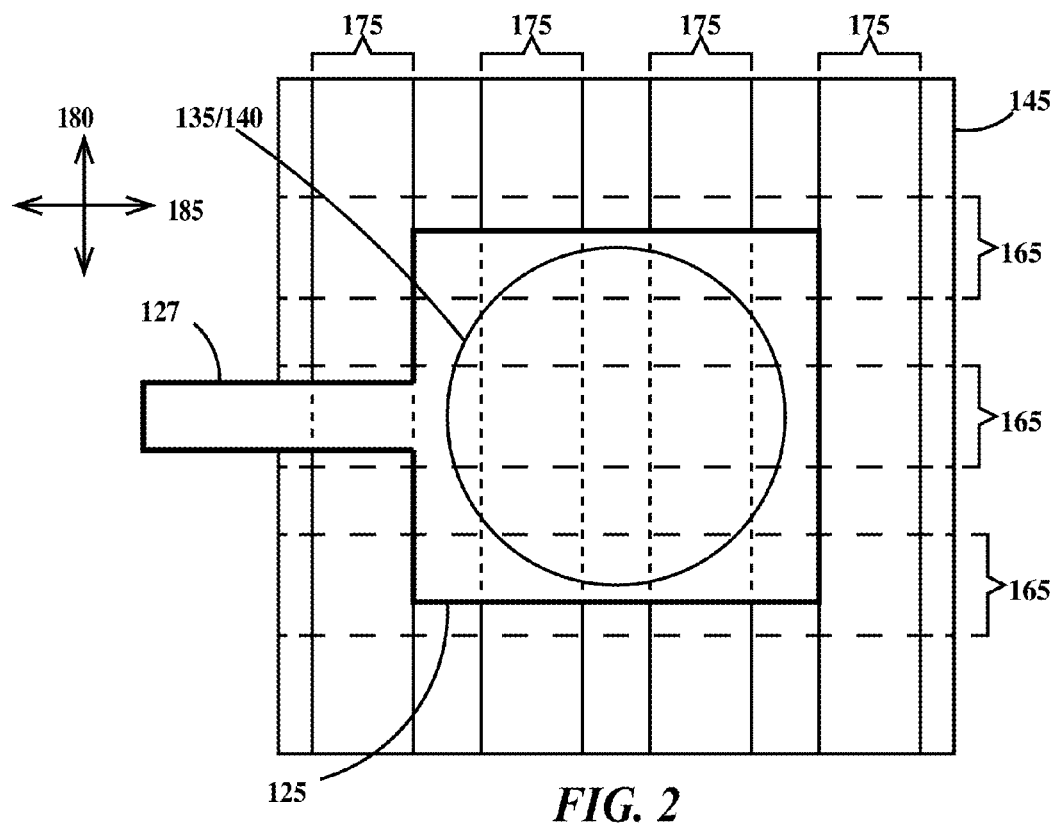
FIG. 2 is a top view of the structures illustrated in FIG. 1.

FIG. 2 is a top view of the structures illustrated in FIG. 1. In FIG. 2, it can be seen that the longitudinal axes of dual-damascene fill wires 175 run in a first direction 180 (as do fill wires 155, see FIG. 1) that is perpendicular to a second direction 185 that the longitudinal axes of dual-damascene fill wires 165 run in. Both the first and second directions are in planes parallel to the top surface of substrate 100. For interconnect levels utilizing fill wires according to embodiments of the present invention, the longitudinal axes of fill wires in any given interconnect level run in a direction perpendicular to the longitudinal axes of fill wires in immediately upper or lower interconnect levels, forming a mesh when viewed from above, the fill wires of each interconnect level are interconnected by via portions of the fill wires of the immediately upper interconnect level where the fill wires cross to complete the mesh. Within a given interconnect level, individual fill wires are not connected to any other fill wire in that interconnect level.

Fill wires 155 (see FIG. 1) are not illustrated in FIG. 2, because, in the example of FIG. 1 the edges of fill wires 155 and 175 align to each other and fill wires 155 are hidden by fill wires 175. Alternatively, fill wires 175 may be shifted to the left or the right so the edges of fill wires 155 and 175 do not align. Further, the widths of fill wires (measured in a direction perpendicular the respective longitudinal axes of the fill wires) 155, 165 and 175 may be the same or different.

While fill wires 155, 165 and 175 are illustrated as terminating at the perimeter of SRZ 145, in various options, some or all of the fill wires may terminate within the perimeter or some or all of the fill wires extend past the perimeter of SRZ 145. See, for example, FIGS. 5, 8, 9, 10 and 11.

Figure 3:
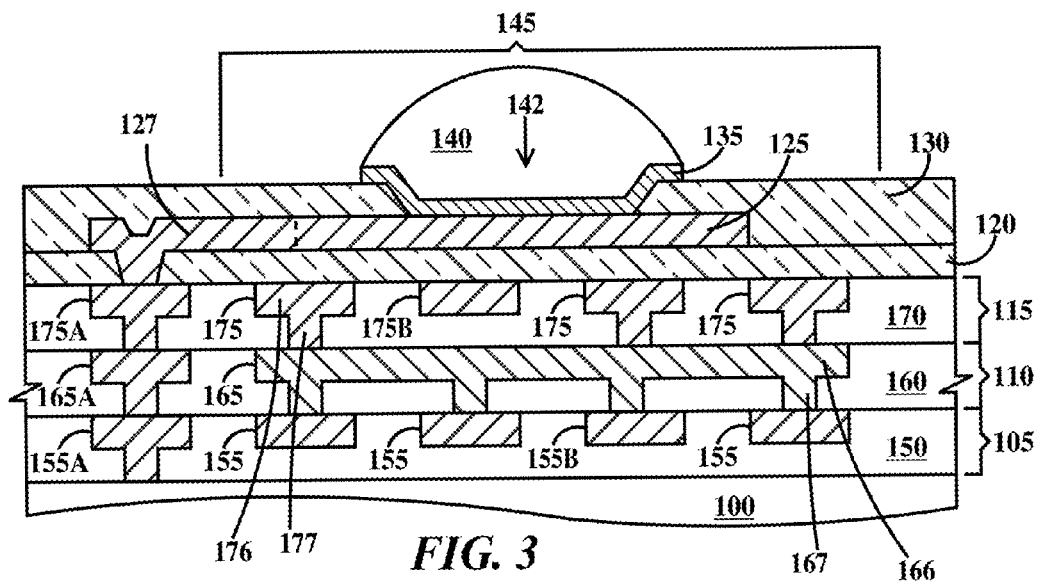
FIG. 3 is a cross-section view through an integrated circuit according to an embodiment of the present invention.
Figure 4:
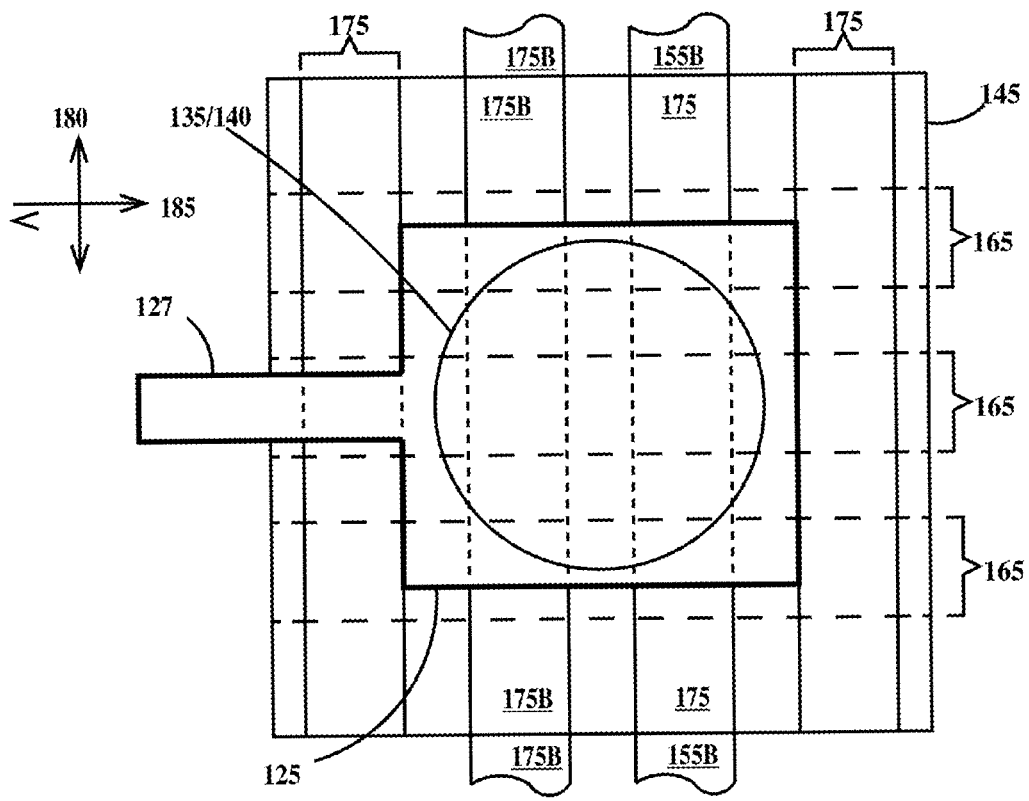
FIG. 4 is a top view of the structures illustrated in FIG. 3.

FIG. 3 is a cross-section view through an integrated circuit according to an embodiment of the present invention and FIG. 4 is a top view of the structures illustrated in FIG. 3. FIG. 3 is similar FIG. 1 and FIG. 4 is similar to FIG. 2 except interconnect level 105 includes an operational passing wire 155B and ULK interconnect layer 115 includes an operational passing wire 175B. An operational passing wire passes through the SRZ. An operational passing wire may carry power or signals. Non-ground operational passing wires are not electrically or physically connected to any fill wire in any interconnect level.

Figure 5:
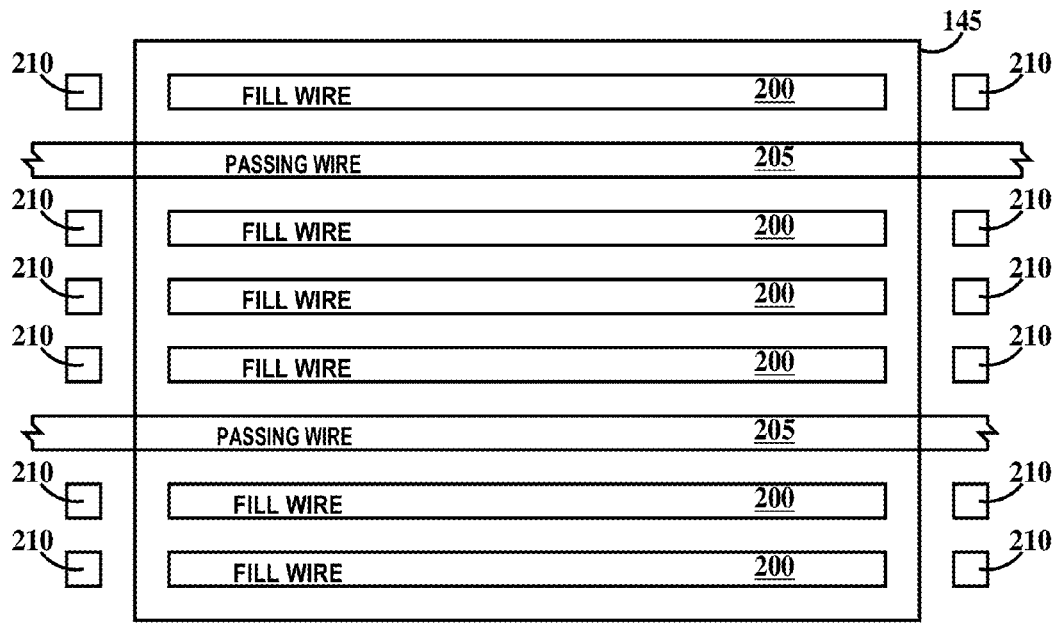
FIG. 5 is a top view of an exemplary fill structure according to an embodiment of the present invention.

FIG. 5 is a top view of an exemplary fill structure according to an embodiment of the present invention. In FIG. 5, fill wires 200 are contained within SRZ 145 and operational passing wires extend through SRZ 145. Additionally, CMP fill shapes 210 have been placed outside of the perimeter of SRZ 145.

Figure 6:
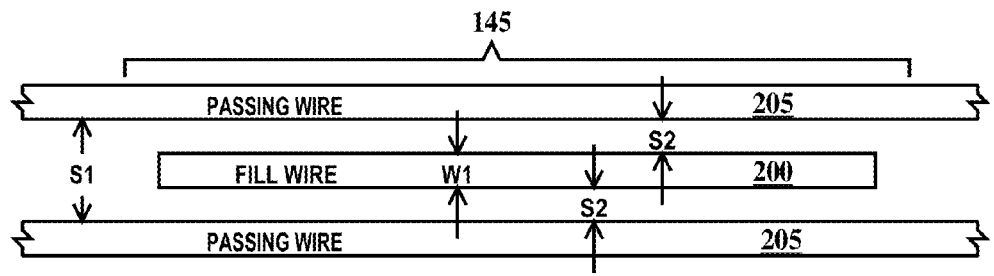
FIG. 6 is a top view illustrating an exemplary first placement rule for fill structures according to embodiments of the present invention.

FIG. 6 is a top view illustrating an exemplary first placement rule for fill structures according to embodiments of the present invention. In FIG. 6, a single fill wire is placed between two operational passing wires 205. Fill wire 200 has a width W1. There are maximum and minimum values for W1 depending on the groundrules for the particular interconnect level. Passing wires 205 are spaced S1 apart. After determining that it is possible to use only one fill wire based on the values for S1 and W1, a fill wire of a width W1 is placed such that the fill wire 200 occupies between about 20% and about 80% of the area between the centerlines of the passing wires 205 in SRZ 145, with about 50% preferred. In one example, the algorithm used selects W1 so fill wire occupies as close to 50% of the area between passing wires 205 in SRZ 145 and is centered between passing wires 205 as close as possible based on the values of S2 and allowable range of W1 and the design grid. The design grid is an X-Y grid of allowable positions that the vertices (i.e., corners) of all shapes of the design are aligned to.

Figure 7:
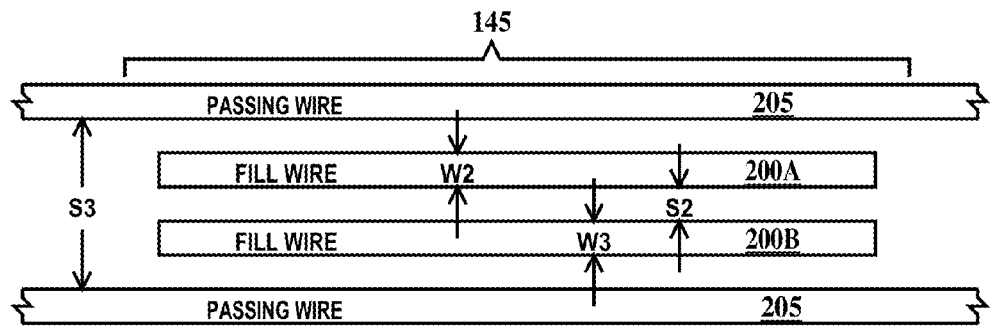
FIG. 7 is a top view illustrating an exemplary second placement rule for fill structures according to embodiments of the present invention.

FIG. 7 is a top view illustrating an exemplary second placement rule for fill structures according to embodiments of the present invention. In FIG. 7, two fill wires are placed between two operational passing wires 205. Fill wire 200A has have a width W2 and fill wire 200B has a width W3 and are spaced apart a distance S2. The values of W2 and W3 may be the same or different. There are maximum and minimum values for W2, W3 and S2 depending on the groundrules for the particular interconnect level. Passing wires 205 are spaced S3 apart. After determining that it is not possible to use only one fill wire based on the values for S2, W2 and W3, two or more (there are only two in the example of FIG. 7) fill wires of width W2 and W3 are placed such that the two fill wires 200 occupy between about 20% and about 80% of the area between the passing wires 205 in SRZ 145, with about 50% preferred. In one example, the algorithm used selects the number of fill wires (two in this example) and the values of W2, W3 and S2 so fill wires 200 occupy as close to 50% of the area between passing wires 205 in SRZ 145 as possible and are as uniformly distributed as possible based on the values of S2 and allowable ranges of W2, W3, S2 and the design grid.

When there are no passing wires in SRZ 145, fill wires of W1 may be placed in SRZ so the fill wires occupy as close to 50% of the area of SRZ as possible. In this case, the value of fill line widths and spacing between fill wires may be pre-selected based on the dimensions of the SRZ. In one example, fill wires are placed as far as possible from signal wires (which carry information, as distinguished from power wires which supply power) that are sensitive to capacitive coupling.

Figure 8:
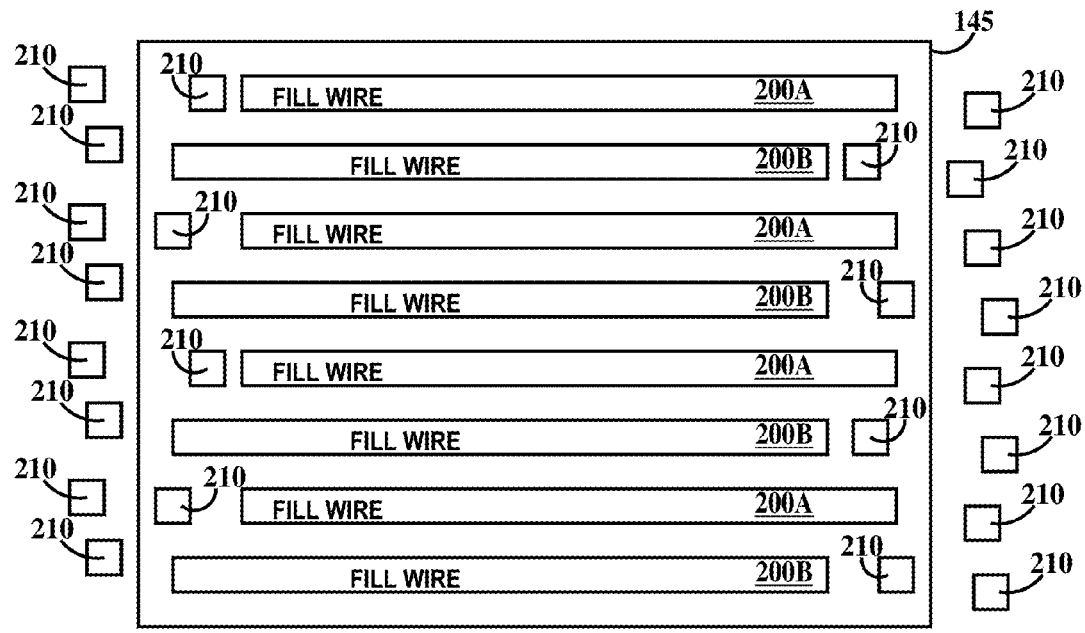
FIGS. 8, 9, 10 and 11 are top views illustrating alternative exemplary fill structures according to an embodiment of the present invention.

FIGS. 8, 9, 10 and 11 are top views illustrating alternative exemplary fill structures according to an embodiment of the present invention. In FIG. 8, all fill wires 200A and 200B are contained with the perimeter of SRZ 145. However, fill wires 200A are shifted to the right relative to fill wires 200B which are shifted to the left. Additionally, CMP fill shapes 210 are placed between the ends of fill wires 200A and 200B within the perimeter of SRZ 145 where space permits. Additionally, CMP fill shapes 210 are placed without the perimeter of SRZ 145. It is preferred that as many edges of CMP fill shapes as possible not co-axially align.

Figure 9:
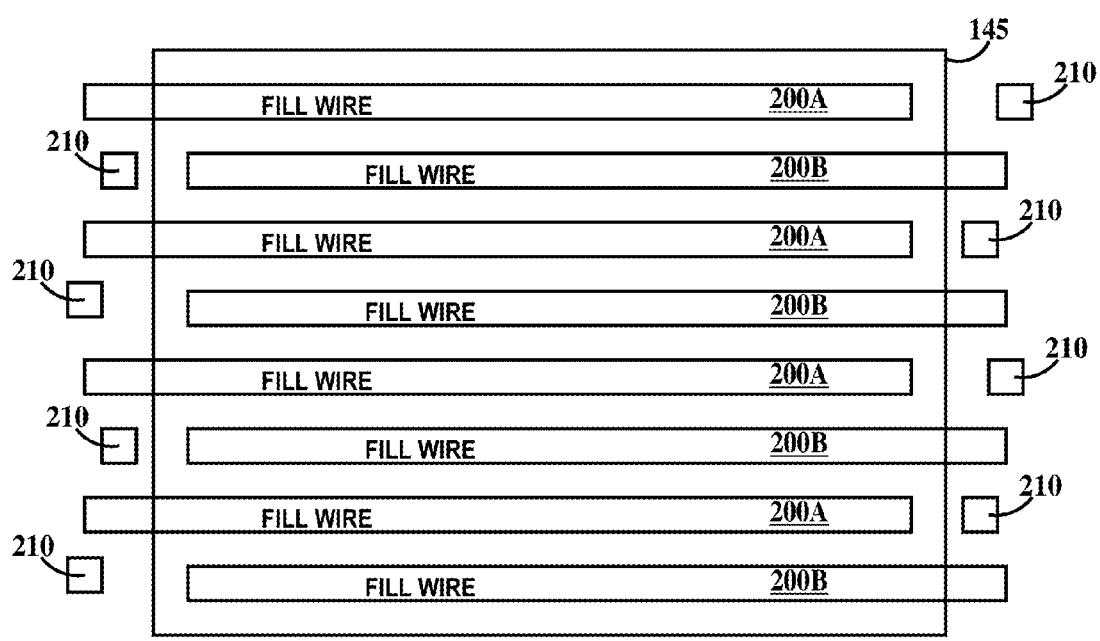

In FIG. 9, only one end of fill wires 200A and 200B are contained with the perimeter of SRZ 145. The second and opposite ends extend past the perimeter of SRZ 145. Fill wires 200A are shifted to the right relative to fill wires 200B which are shifted to the left. Additionally, CMP fill shapes 210 are placed without the perimeter of SRZ 145. It is preferred that as many edges of CMP fill shapes as possible not co-axially align. Alternatively, both ends of fill wires 200A and 200B may extend past the perimeter of SRZ 145.

Figure 10:
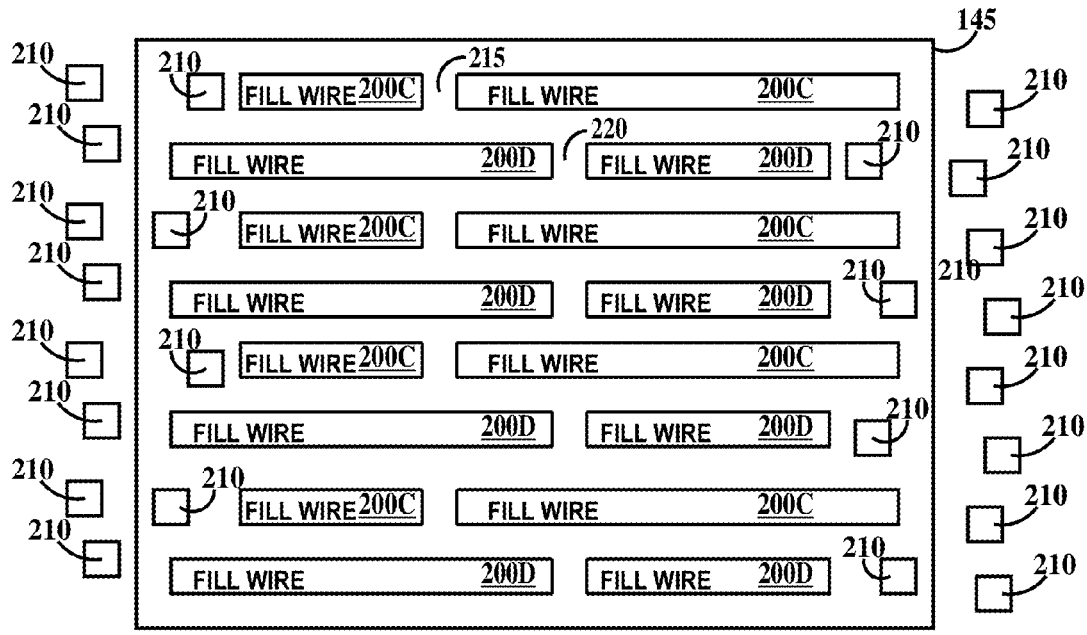

FIG. 10 is similar to FIG. 8 except that fill wires 200A of FIG. 8 are broken into two fill wires 200C separated by a gap 215 and fill wires 200B of FIG. 8 are broken into two fill wires 200D separated by a gap 220.

Figure 11:
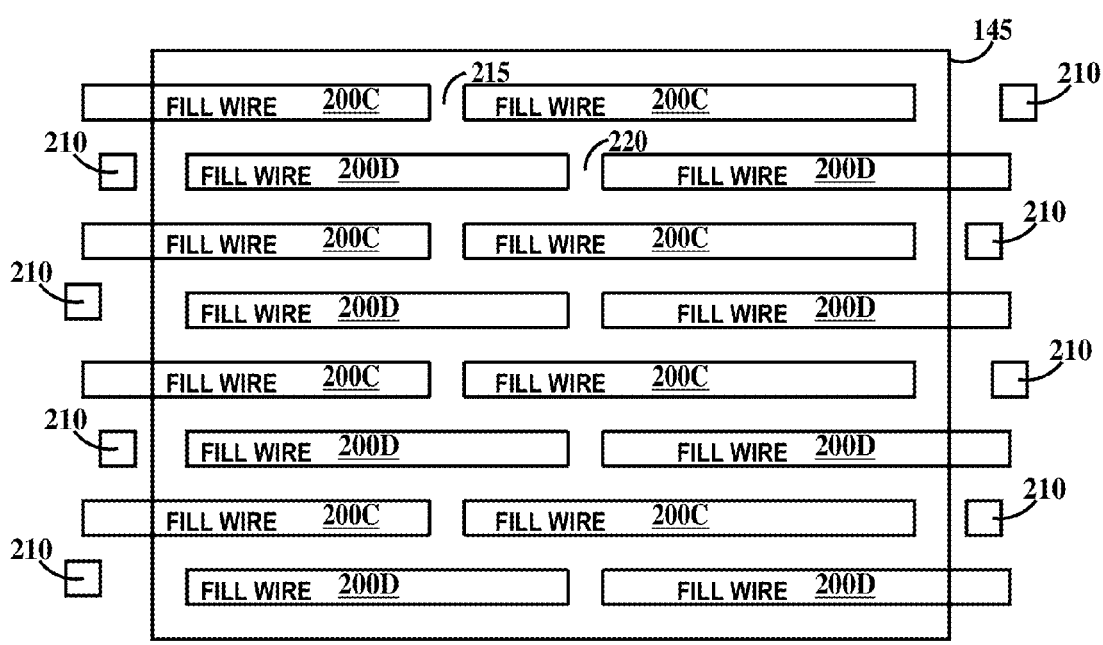

FIG. 11 is similar to FIG. 9 except that fill wires 200A of FIG. 8 are broken into two fill wires 200C separated by a gap 215 and fill wires 200B of FIG. 8 are broken into two fill wires 200D separated by a gap 220. Alternatively, one end of all fill wires 200C and 200D may extend past the perimeter of SRZ 145.

It should be understood, that the layout of fill wires 200A and 200B of FIGS. 8 and 9 and fill wires 200C and 200D of FIGS. 10 and 11 may be adapted when there are passing wires passing through SRZ 145.

Figure 12:
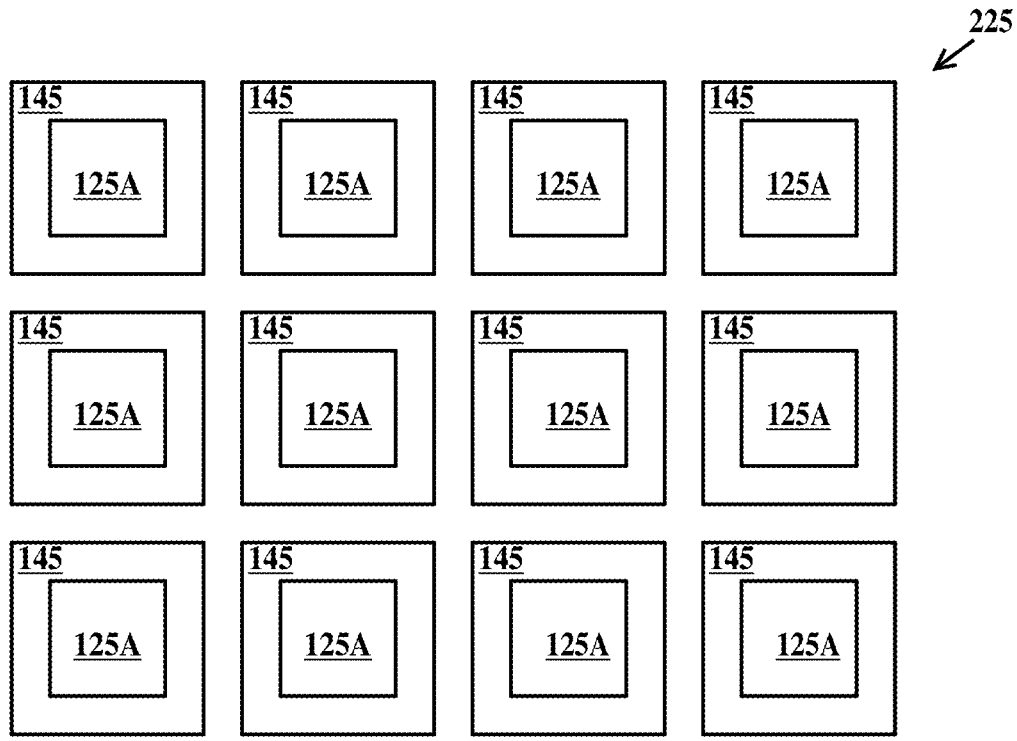
FIGS. 12 and 13 are top views illustrating embodiments of the present invention applied to arrays of bond pads.
Figure 13:
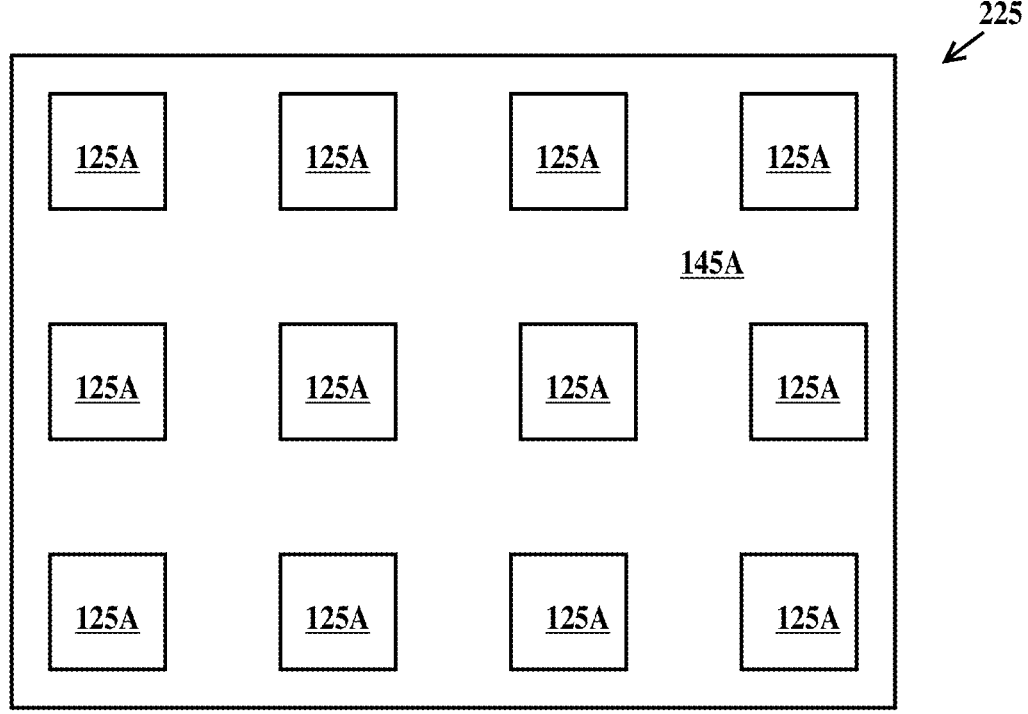

FIGS. 12 and 13 are top views illustrating embodiments of the present invention applied to arrays of bond pads. In FIG. 12, each C4 bond pad 125A (hereafter bond pad 125A) of an array of bond pads 225 is contained within perimeters of respective SRZs 145. In FIG. 13, an array of bond pads 125A are contained with the perimeter of a single SRZ 145A.

Figure 14:
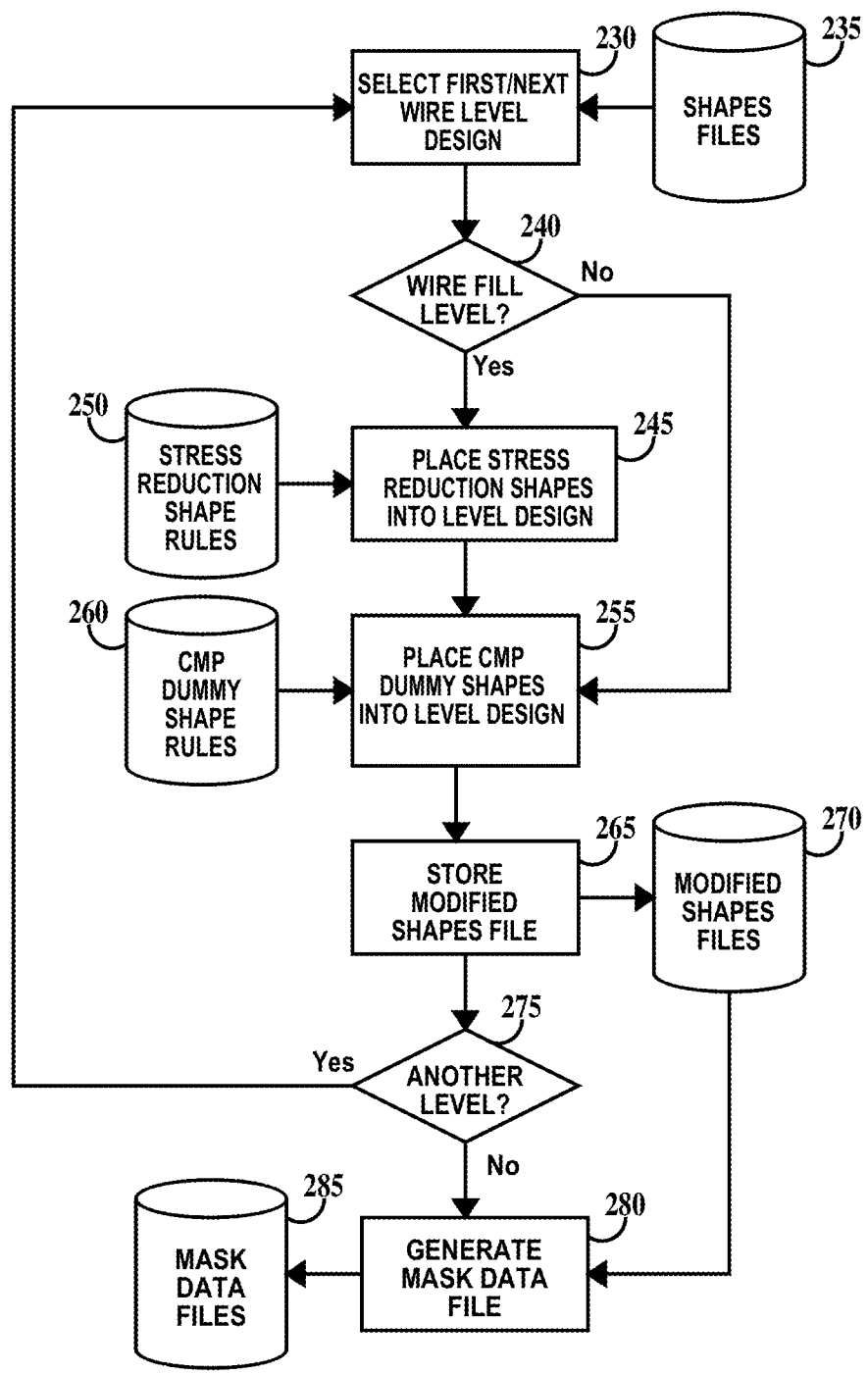
FIG. 14 is a flowchart illustrating a method of designing integrated circuits using fill structures according to embodiments of the present invention.

FIG. 14 is a flowchart illustrating a method of designing integrated circuits using fill structures according to embodiments of the present invention. In step 230, the first/next interconnect level design is chosen from design shapes files 235. It should be understood that for interconnect levels that use only single damascene levels there is only a wire shapes file. For interconnect levels that use dual-damascene levels there is a wire shapes file and a via shapes file. Each of these two files is a separate design shapes file.

In step 240, it is determined if the interconnect level selected is a interconnect level where wire fill (either a wire portion or a via portion) is to be added. This may be accomplished by a simple flag system built into the shapes file. If fill wires are to be added, the method proceeds to step 245, otherwise to step 255. In step 245, the SRZ around each bonding pad is determined and stress reduction shapes placed in those regions based on stress reduction shapes rules file 250. The stress reduction shapes will be either via fill shapes placed in the via datasets or wire fill shapes placed in the wire datasets for dual-damascene fill wires or just wire fill shapes placed in the wire datasets for single-damascene fill wires. Via fill shapes are placed on the design grid to as to intersect wire fill shapes in the SRZ. One method of accomplishing adding stress reduction shapes is to select a pre-determined pattern of stress reduction shapes and then remove sections of that pattern where passing wire shapes exist in the design and then add the modified stress reduction shapes pattern to the design. The method then proceeds to step 255.

In step 255, CMP dummy shapes are placed in the design without the SRZ (and optionally, within the SRZ). The placement of CMP dummy shapes is based on CMP dummy shape rules 260. One method of accomplishing adding CMP dummy shapes is to select a pre-determined pattern of CMP dummy shapes and then remove sections of that pattern where wire fill and passing wire shapes exist in the design and then add the modified CMP dummy shape pattern to the design. It is preferred to place CMP dummy fill shapes after placing stress reduction shapes so as to not add the burden of extra time, extra cost and extra computer resource to removing previously placed CMP dummy shapes from the design.

Next, in step 265, the modified shapes file is stored in modified shapes files 270 and the method proceeds to step 275. In step 275, it is determined if there is another interconnect level in the design. If there is another interconnect level, the method loops back to step 230, otherwise the method proceeds to step 280. In step 280, using modified shapes files 270, mask data files 285 are generated. Mask data files contain the data necessary to create photomasks (or control files for direct write photolithography, e.g., e-beam) to fabricate the integrated circuit.

Generally, the method described herein with respect to a method of designing reduced delamination integrated circuits is practiced with a general-purpose computer and the methods described supra in the flow diagrams of FIG. 14 may be coded as a set of instructions on removable or hard media for use by the general-purpose computer.

Figure 15:
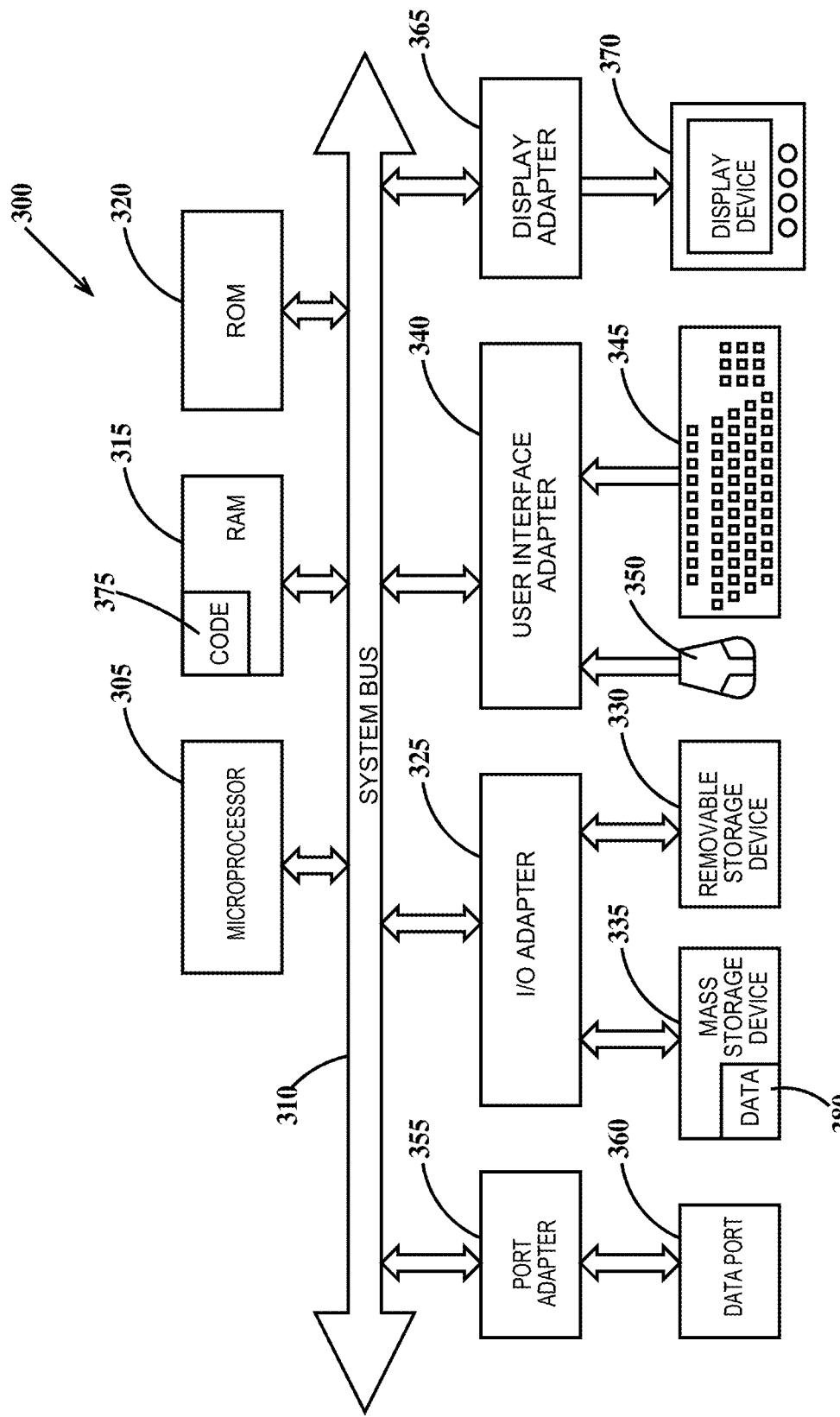
FIG. 15 is a schematic block diagram of a general-purpose computer that may be used in designing integrated circuits using fill structures according to embodiments of the present invention.

FIG. 15 is a schematic block diagram of a general-purpose computer. In FIG. 15, computer system 300 has at least one microprocessor or central processing unit (CPU) 305. CPU 305 is interconnected via a system bus 310 to a random access memory (RAM) 315, a read-only memory (ROM) 320, an input/output (I/O) adapter 325 for connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

ROM 320 contains the basic operating system for computer system 300. The operating system may alternatively reside in RAM 315 or elsewhere as is known in the art. Examples of removable data and/or program storage device 330 include magnetic media such as floppy drives and tape drives and optical media such as CD-ROM drives. Examples of mass data and/or program storage device 335 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for the computer program created to run the present invention is loaded on the appropriate removable data and/or program storage device 330, fed through data port 360 or typed in using keyboard 345.

Thus, the embodiments of the present invention provide structures for, methods of fabricating, and method of designing reduced delamination integrated circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:
1. A structure, comprising:
   a set of interconnect levels over a semiconductor substrate, each interconnect level of said set of interconnect levels comprising operational wires embedded in an interlevel dielectric layer, one or more of said operational wires electrically connected to said semiconductor substrate;

a dielectric barrier layer on an uppermost interconnect level of said set of interconnect levels and a bonding pad on said barrier layer, said bonding pad electrically connected to an operational wire of said one or more operational wires through an opening in said barrier layer;

a passivation layer on said barrier layer and said bonding pad;

a ball limiting metallurgy layer on said bonding pad through an opening in said passivation layer and a solder-bump on said ball limiting metallurgy layer;

a stress reduction zone surrounding a perimeter of said bonding pad and extending into said set of interconnect levels;

elongated fill wires in at least three of said interconnect levels in said stress reduction zone between said bonding pad and said semiconductor substrate, said elongated fill wires (i) not connected to any of said operational wires or (ii) connected only to a ground network;

said elongated fill wires of each interconnect level of each set of interconnect levels physically connected to elongated fill wires of immediately upper and lower interconnect levels of said set of interconnect levels; and wherein said set of interconnect levels intervene between said bonding pad and said semiconductor substrate.

2. The structure of claim 1, wherein for each interconnect level of said set of interconnect levels, longitudinal axes of each elongated fill wire are parallel to each other in a plane parallel to a top surface of said substrate.

3. The structure of claim 1, wherein for each interconnect level of said set of interconnect levels, longitudinal axes of each elongated fill wire are parallel to each other in a plane parallel to a top surface of said substrate and perpendicular to the longitudinal axes of elongated fill wires of immediately adjacent interconnect levels of said set of interconnect levels.

4. The structure of claim 1, including:
one or more operational passing wires passing through said stress reduction zone in one or more of said interconnect levels of said set of interconnect levels.

5. The structure of claim 1, including:
one or more additional interconnect levels between said set of interconnect levels and said substrate, said stress reduction zone extending into said additional interconnect levels; and
fill wires in at least one interconnect level of said one or more additional interconnect levels physically connected to fill wires in said set of interconnect levels.

6. The structure of claim 1, including:
chemical-mechanical-polish (CMP) fill shapes in each interconnect level of said set of interconnect levels.

7. The structure of claim 1, wherein said interlevel dielectric layers of said set of interconnect levels each independently comprise a material having a relative permittivity of about 2.4 or less and a modulus of about of about 5 GPa or less.

8. A method, comprising:
forming a set of interconnect levels over a semiconductor substrate, each interconnect level of said set of interconnect levels comprising operational wires embedded in an interlevel dielectric layer, one or more of said operational wires electrically connected to said semiconductor substrate;

forming a dielectric barrier layer on an uppermost interconnect level of said set of interconnect levels and a bonding pad on said barrier layer, said bonding pad electrically connected to an operational wire of said one or more operational wires through an opening in said barrier layer;

forming a passivation layer on said barrier layer and said bonding pad;

forming a ball limiting metallurgy layer on said bonding pad through an opening in said passivation layer and forming a solder-bump on said ball limiting metallurgy layer;

designating a stress reduction zone surrounding a perimeter of said bonding pad and extending into said set of interconnect levels;

forming elongated fill wires in at least three of said interconnect levels in said stress reduction zone between said bonding pad and said semiconductor substrate, said elongated fill wires (i) not connected to any of said operational wires or (ii) connected only to a ground network;

wherein said elongated fill wires of each interconnect level of each set of interconnect levels are physically connected to elongated fill wires of immediately upper and lower interconnect levels of said set of interconnect levels; and wherein said set of interconnect levels intervene between said bonding pad and said semiconductor substrate.

9. The method of claim 8, wherein for each interconnect level of said set of interconnect levels, longitudinal axes of each elongated fill wire are parallel to each other in a plane parallel to a top surface of said substrate.

10. The method of claim 8, wherein for each interconnect level of said set of interconnect levels, longitudinal axes of each elongated fill wire are parallel to each other in a plane parallel to a top surface of said substrate and perpendicular to the longitudinal axes of elongated fill wires of immediately adjacent interconnect levels of said set of interconnect levels.

11. The method of claim 8, including:
forming one or more operational passing wires passing through said stress reduction zone in one or more of said interconnect levels of said set of interconnect levels.

12. The method of claim 8, including:
forming one or more additional interconnect levels between said set of interconnect levels and said substrate, said stress reduction zone extending into said additional interconnect levels; and
wherein fill wires in at least one interconnect level of said one or more additional interconnect levels are physically connected to fill wires in said set of interconnect levels.

13. The method of claim 8, including:
forming chemical-mechanical-polish (CMP) fill shapes in each interconnect level of said set of interconnect levels.

14. The method of claim 8, wherein said interlevel dielectric layers of said set of interconnect levels each independently comprise a material having a relative permittivity of about 2.4 or less and a modulus of about of about 5 GPa or less.

15. A method, comprising:
(a) selecting an integrated circuit design, said integrated circuit comprising:
a set of interconnect levels over a semiconductor substrate, each interconnect level of said set of interconnect levels comprising operational wires embedded in an interlevel dielectric layer, one or more of said operational wires electrically connected to said semiconductor substrate;
a dielectric barrier layer on an uppermost interconnect level of said set of interconnect levels and a bonding pad on said barrier layer, said bonding pad electrically connected to an operational wire of said one or more operational wires through an opening in said barrier layer;

a passivation layer on said barrier layer and said bonding pad;

a ball limiting metallurgy layer on said bonding pad through an opening in said passivation layer and a solder-bump on said ball limiting metallurgy layer;

a designated stress reduction zone surrounding a perimeter of said bonding pad and extending into said set of interconnect levels;

elongated fill wires in at least three of said interconnect levels in said stress reduction zone between said bonding pad and said semiconductor substrate, said elongated fill wires (i) not connected to any of said operational wires or (ii) connected only to a ground network;

wherein said elongated fill wires of each interconnect level of each set of interconnect levels are physically connected to elongated fill wires of immediately upper and lower interconnect levels of said set of interconnect levels; and wherein said set of interconnect levels intervene between said bonding pad and said semiconductor substrate;

(b) selecting an interconnect level design from a set of interconnect level designs of said integrated circuit design;

(c) using a computer, placing stress reduction shapes representing fill wire portions or via portions of elongated fill wires into said selected interconnect level design, said selected interconnect level design including shapes representing operational wires to generate a first modified interconnect level design;

(d) using a computer, placing chemical-mechanical-polish (CMP) dummy shapes into said first modified interconnect level design to generate a second modified interconnect level design;

(e) storing said second modified design on a computer readable medium; and (f) repeating steps (b) through (e) for each interconnect level design of said set of interconnect designs.

16. The method of claim 15, wherein for each interconnect level design of said set of interconnect level designs representing wire portions of fill wires, longitudinal axes of each elongated stress reduction shape are parallel to each other.

17. The structure of claim 15, wherein for each interconnect level design of said set of interconnect level designs representing wire portions of fill wires, longitudinal axes of each elongated stress reduction shape are parallel to each other and perpendicular to the longitudinal axes of elongated stress reduction shapes of immediately adjacent interconnect level designs of said set of interconnect level designs.

18. The method of claim 17, including wherein for each interconnect level design of said set of interconnect level designs, said stress reduction shapes representing said via portions are placed where elongated stress reduction shapes of immediately previous and subsequent interconnect level designs cross.

19. The method of claim 15, wherein for each interconnect level design of said set of interconnect level designs, (i) said stress reduction shapes representing fill wire portions or via portions of said elongated fill wires do not touch said shapes representing operational wires or touch said CMP dummy shapes and (ii) said shapes representing operational wires to not touch said CMP dummy shapes.

20. The method of claim 15, including:
using a computer, generating a respective mask data file from each of second modified designs.

21. The method of claim 8, wherein said semiconductor substrate contains devices and one or more of said operational wires is electrically connected to said devices.

22. The method of claim 15, wherein said semiconductor substrate contains devices and one or more of said operational wires is electrically connected to said devices.

* * * * *